(12) United States Patent
Schwantner et al.

(10) Patent No.: US 9,358,888 B2
(45) Date of Patent: Jun. 7, 2016

(54) DISPLAY DEVICE OF A MOTOR VEHICLE AND METHOD FOR OPERATING A DISPLAY DEVICE OF THIS TYPE

(71) Applicant: AUDI AG, Ingolstadt (DE)

(72) Inventors: Stephan Schwantner, Haunstetten (DE); Christian Wall, Hitzhofen (DE)

(73) Assignee: AUDI AG, Ingolstadt (DE)

( * ) Notice: Subject to any disclaimer, the term of this patent is extended or adjusted under 35 U.S.C. 154(b) by 0 days.

(21) Appl. No.: 14/415,912

(22) PCT Filed: Jul. 9, 2013

(86) PCT No.: PCT/EP2013/002012
§ 371 (c)(1),
(2) Date: Jan. 20, 2015

(87) PCT Pub. No.: WO2014/012634
PCT Pub. Date: Jan. 23, 2014

(65) Prior Publication Data
US 2015/0191085 A1   Jul. 9, 2015

(30) Foreign Application Priority Data
Jul. 20, 2012   (DE) .......................... 10 2012 014 351

(51) Int. Cl.
*G09G 3/34* (2006.01)
*B60K 37/02* (2006.01)
*H03K 17/96* (2006.01)

(52) U.S. Cl.
CPC .............. *B60K 37/02* (2013.01); *G09G 3/3413* (2013.01); *B60K 2350/106* (2013.01); *B60K 2350/1036* (2013.01); *B60K 2350/203* (2013.01); *B60K 2350/2008* (2013.01);
(Continued)

(58) Field of Classification Search
None
See application file for complete search history.

(56) References Cited

U.S. PATENT DOCUMENTS 5,210,467 A   5/1993   Nagashima
7,256,385 B2  8/2007   Rüttiger et al.
(Continued)

FOREIGN PATENT DOCUMENTS

DE   8501594   4/1985
DE   4212361   3/1993
(Continued)

OTHER PUBLICATIONS

English language translation of the International Preliminary Report on Patentability for PCT/EP2013/002012, mailed Feb. 12, 2015, 6 pages.
(Continued)

*Primary Examiner* — Quan-Zhen Wang
*Assistant Examiner* — Chad Dicke
(74) *Attorney, Agent, or Firm* — Staas & Halsey LLP

(57) ABSTRACT

A display apparatus in a motor vehicle has at least one display element, which can be used to display at least one value and which has at least one light-emitting element for adjusting a display brightness for the display element. A sensing device has, a sensing element for sensing an ambient brightness for surroundings of the display element. The display brightness can be adjusted by the light-emitting element on the basis of the sensed ambient brightness. The sensing device is designed to prompt at least one function of the motor vehicle that is different than the adjustment of the display brightness when a change in the ambient brightness is sensed. A method operates such a display apparatus.

17 Claims, 2 Drawing Sheets

(52) U.S. Cl.
CPC .. *B60K 2350/2069* (2013.01); *B60K 2350/352* (2013.01); *G09G 2320/0626* (2013.01); *G09G 2360/144* (2013.01); *G09G 2380/10* (2013.01); *H03K 17/9627* (2013.01); *H03K 2217/94106* (2013.01)

(56) References Cited

U.S. PATENT DOCUMENTS

| | | | | |
|---|---|---|---|---|
| 7,340,125 | B1* | 3/2008 | Doty | G01R 33/283 385/140 |
| 2004/0046713 | A1* | 3/2004 | Tanaka | B60K 35/00 345/33 |
| 2005/0133351 | A1* | 6/2005 | Hein | H01H 13/83 200/310 |
| 2008/0169134 | A1* | 7/2008 | Tomolillo | B60J 1/04 180/6.24 |
| 2012/0319828 | A1* | 12/2012 | Krauss | B60K 35/00 340/425.5 |
| 2013/0181941 | A1* | 7/2013 | Okuno | G06F 3/041 345/174 |

FOREIGN PATENT DOCUMENTS

| | | |
|---|---|---|
| DE | 4305446 | 8/1994 |
| DE | 4336669 | 12/1994 |
| DE | 10021101 | 11/2001 |
| DE | 10341622 | 8/2005 |
| DE | 102006005418 | 8/2007 |
| DE | 102006038176 | 2/2008 |
| WO | 2005/025921 | 3/2005 |

OTHER PUBLICATIONS

German Office Action for German Priority Patent Application No. 10 2012 014 351.6, issued May 8, 2013.

English language International Search Report for PCT/EP2013/002012, mailed Apr. 9, 2014, 3 pages.

PCT/EP2013/002012, Jul. 9, 2013, Stephan Schwantner et al., Audi Ag.

DE 102012014351.6, Jul. 20, 2012, Stephan Schwantner et al., Audi Ag.

\* cited by examiner (State of the art)

DISPLAY DEVICE OF A MOTOR VEHICLE AND METHOD FOR OPERATING A DISPLAY DEVICE OF THIS TYPE

CROSS REFERENCE TO RELATED APPLICATIONS

This application is based on and hereby claims priority to International Application No. PCT/EP2013/002012 filed on Jul. 9, 2013 and German Application No. 10 2012 014 351.6 filed on Jul. 20, 2012, the contents of which are hereby incorporated by reference.

BACKGROUND

The invention relates to a display apparatus in a motor vehicle and to a method for operating a display apparatus.

Such display apparatuses in motor vehicles and methods for operating such display apparatuses are sufficiently well known from the mass production of motor vehicles. FIG. 1 shows a schematic front view of such a display apparatus 10 according to the related art. The display apparatus 10 is usually also called a combination instrument and used for automobiles of the AUDI brand.

The display apparatus 10 comprises a first display element 12 in the form of what is known as a tachometer, which can be used to display values for a speed of an internal combustion engine for driving the automobile. To this end, the display element 12 comprises a value scale 14 with the values for the speed and also a pointer 18 that can be swiveled along the value scale 14 about a swivel axis 16 and that displays the current value of the speed. In the present case, the internal combustion engine is deactivated, which means that the value of the speed is 0.

The display apparatus 10 comprises a second display element 20 in the form of what is known as a speedometer, which can be used to display values for a vehicle speed of the automobile. To this end, the display element 20 comprises a value scale 22 with values for the vehicle speed and also a pointer 26 that can be swiveled along the value scale 22 about a swivel axis 24 in order to display the current value of the vehicle speed. In the present case, the automobile is stationary, which means that the value of the vehicle speed is 0.

The display apparatus 10 also comprises a third display element 28 for displaying values that characterize a filled level of a fuel tank in the automobile. Furthermore, a fourth display element 30 for displaying values for a coolant temperature or a lubricating oil temperature is provided.

In addition, the display apparatus 10 comprises a fifth display element 32 that comprises a liquid crystal screen for displaying different values. One of these values is the current time of day 34 in the present case. Another of these values is a range 36 for which the automobile can still be driven by the internal combustion engine using a quantity of fuel remaining in the fuel tank.

The display elements 12, 20, 28, 30, 32 each comprise at least one light-emitting element for adjusting a display brightness for the respective display elements 12, 20, 28, 30, 32. In order to create agreeable brightness conditions for the driver of the automobile, the respective display brightness is adjusted by the relevant light-emitting element such that the display elements 12, 20, 28, 30, 32 have at least substantially the same display brightnesses.

The display apparatus 10 (combination instrument) also comprises a sensing device, not visible in FIG. 1, having at least one sensing element 38 for sensing an ambient brightness for surroundings of the display elements 12, 20, 28, 30, 32.

In this case, the method for operating the display apparatus 10 involves the respective display brightness being adjusted on the basis of the sensed ambient brightness. In other words, the respective display brightness can be adjusted by the respective light-emitting element on the basis of the sensed ambient brightness. By way of example, the sensing element 38 is a photodiode or a phototransistor.

The display apparatus 10 also comprises an operating element 40, which is in the form of a pushbutton in the present case. Pushing of the operating element 40, for example by the driver of the automobile, allows a function of the automobile and—in the present case—of the display apparatus 10 to be prompted. In the present case, this function is that operation, i.e. pushing of the operating element 40, adjusts a value for an odometer reading for the automobile to 0. The odometer reading is what is known as a daily odometer reading, which indicates a distance in kilometers that the automobile has covered since the operating element 40 was last operated. In other words, the odometer reading can be adjusted to 0 by the mechanical operating element 40.

The use of the mechanical operating element 40 to prompt this function requires both development and manufacture of the operating element 40, which results in relatively high costs for the display apparatus 10.

DE 100 21 101 B4 discloses a display apparatus in a vehicle, wherein a large number of pieces of information can be displayed in the display apparatus. The display apparatus is lit by differently colored light sources, particularly cold-cathode fluorescent lamps. The display apparatus contains a liquid crystal cell, with the differently colored light sources being able to be actuated by a control unit. The control unit can sense and evaluate at least one trip parameter of the vehicle, with a brightness of the differently colored light source being able to be altered by the control unit on the basis of the trip parameter. In this case, the liquid crystal cell can be backlit by the differently colored light sources.

In addition, DE 35 01 594 U1 discloses a cockpit instrument for motor vehicles for displaying speed and/or boost pressure and/or engine speed and/or fuel display and/or oil pressure and/or oil temperature and/or alternator voltage and/or battery charge state or the like with a housing that is closed by a front panel and that contains a measuring element. In this case, provision is made for the front panel to have a plurality of light-emitting diodes of the same type secured to or on it in a linear arrangement with respect to one another.

SUMMARY

It is one possible object to develop further a display apparatus in a motor vehicle and also a method for operating such a display apparatus of the type cited at the outset such that the display apparatus has particularly low costs.

The inventors propose a display apparatus in a motor vehicle, having at least one display element, which can be used to display at least one value and which has at least one light-emitting element for adjusting a display brightness for the display element. The display apparatus additionally comprises a sensing device having at least one sensing element for sensing an ambient brightness for surroundings of the display element. In this case, the display brightness can be adjusted by the light-emitting element on the basis of the sensed ambient brightness.

According to the proposals, the sensing device is designed to prompt at least one function of the motor vehicle that is different than the adjustment of the display brightness when a change in the ambient brightness is sensed. In other words, the sensing device is used not only to adjust the display brightness on the basis of the sensed ambient brightness but also to prompt the at least one function of the motor vehicle that is different than the adjustment of the display brightness on the basis of the change in the ambient brightness. This makes it possible to dispense with additional and, in particular, mechanical operating elements for prompting the function that would require additional development and manufacturing involvement. As a result, the costs of the display apparatus can be kept particularly low.

Mechanical operating elements of this kind also have a certain installation space requirement that needs to be kept free as appropriate when a mechanical operating element of this kind is used. The provision of this additional installation space can be avoided in the case of the proposed display apparatus. Furthermore, mechanical operating elements are subject to mechanical wear, and this can likewise be avoided when using the sensing device for prompting the function.

In addition, there is no need to provide a transmission mechanism, for example in order to transmit operation of a mechanical operating element to a corresponding switch. Furthermore, the operation of mechanical operating elements can result in noise, and this can likewise be avoided in the case of the display apparatus. By contrast, it is possible, by way of example, for audible feedback about the prompting of the function, for example to the driver of the motor vehicle, to be adjusted as desired. Furthermore, the weight of the display apparatus can be kept low, since it is possible to dispense with weight-intensive mechanical operating elements and also associated wiring that needs to be used to prompt the function.

In one advantageous embodiment, the function that is different than the adjustment of the display brightness comprises alteration of the value that can be displayed by the display element. In other words, the value is altered when the function is prompted. This is advantageous insofar as the function that can be prompted by the sensing element arranged on the display apparatus is locally also associated with the display apparatus.

Preferably, the function comprises zeroing of the value of an odometer reading for the motor vehicle that can be displayed by the display element, said odometer reading preferably being what is known as a daily odometer ("trip odometer") reading. In this case the value of the daily odometer reading indicates a distance, for example in kilometers, for which the motor vehicle has been moved since the function was last prompted, i.e. since the value was last reset. In this case, the function can be prompted advantageously in terms of ergonomics, since the light-emitting element can be positioned at points of the display apparatus that are advantageous in terms of ergonomics.

In a further advantageous embodiment, the sensing device is designed to prompt the function that is different than the adjustment of the display brightness on a basis of a decrease sensed by the sensing device as the alteration of the ambient brightness. This makes it a particularly simple matter for the driver of the motor vehicle to prompt the function, since he merely needs to at least partially cover the sensing element, which is a photodiode or a phototransistor, for example. To this end, the driver can keep his finger over or on the sensing element, for example.

It has been found to be advantageous if the sensing device is designed to prompt the function that is different than the adjustment of the display brightness when the ambient brightness decreases by a prescribable amount within a prescribable period of time. This means that it is possible for the prompting of the function by the prompting of the alteration of the display brightness, so that, by way of example, the function is only ever prompted if the driver so desires, without altering the display brightness.

Hence, if sudden darkening occurs that is sensed by the sensing element, with the ambient brightness dropping by a relatively large amount within a short period of time, since the driver is covering the sensing element, the function that is different than the adjustment of the display brightness is prompted. However, if contrastingly less rapid darkening occurs, with the ambient brightness being decreased over a relatively long period of time and/or by a contrastingly smaller amount, since the motor vehicle is being driven into a tunnel, for example, then—without prompting the function that is different than the adjustment of the display brightness—the display brightness is adjusted or altered and matched to the now darker ambient conditions. This creates agreeable lighting conditions for the driver without undesirably prompting the function that is different than the adjustment of the display brightness.

In a further advantageous embodiment, the sensing device is designed to prompt the function that is different than the adjustment of the display brightness in the event of a first type of alteration of the ambient brightness and to prompt at least one second function, which is different than the function and than the adjustment of the display brightness, in the event of a second type of alteration of the ambient brightness, which is different than the first type of alteration of the ambient brightness. This provides a particularly large scope of function performance for the sensing device, since it is not just used to match the display brightness to the ambient brightness but is also used to prompt the two different functions.

By way of example, the first function may be the zeroing of the value of the odometer reading, particularly the daily odometer reading. By way of example, the second function may be zeroing of a value that characterizes an average fuel consumption by the motor vehicle, an average speed of the motor vehicle and/or another value. The second function may also be another function that is different than the adjustment of the display brightness and than the first function. In this case, the sensing device is assigned not just a dual function but really a triple function. Allowing such a multiple function makes it possible to dispense with mechanical operating elements, which means that the display apparatus can be manufactured and fitted particularly inexpensively. Furthermore, the weight of the display apparatus can be kept low in this way.

In order to isolate the prompting of the two functions that are each different than the adjustment of the display brightness from one another in a distinct manner, a further embodiment has provision for the types of alteration of the ambient brightness to differ from one another in terms of a frequency of a decrease, which frequency is sensed by the sensing device within a prescribable period of time, as the alteration of the ambient brightness and/or in terms of a period of time within which the sensing device senses a drop below a prescribable threshold value by the ambient brightness. In other words, if the first function that is different than the adjustment of the display brightness is intended to be prompted for example, then the ambient brightness is darkened within the prescribable period of time less frequently than if the second function that is different than the adjustment of the display brightness and than the first function is intended to be prompted. If the ambient brightness is decreased by a prescribable amount once within the prescribable period of time, for example, then the first function is prompted. If the ambient brightness is decreased by the prescribable amount more frequently, i.e. at least twice, within the prescribable period of time, however, with the ambient brightness being increased between the respective decrease, for example by virtue of a cover over the sensing element being lifted, then the second function is prompted.

Additionally, or alternatively, provision may be made for the first function to be prompted if the sensing device is used to sense that the ambient brightness drops below the prescribable threshold value within a prescribable first period of time. If the sensing device is used to sense that the ambient brightness drops below the prescribable threshold value over a prescribable second period of time, which is longer than the first period of time, then the second function is prompted.

In order to prevent the function or functions that is/are different than the adjustment of the display brightness from being mistriggered particularly reliably, at least one further criterion may be provided, which, when met, provides that the function or functions that is/are different than the adjustment of the display brightness to be prompted when an alteration of the ambient brightness arises that is sensed by the light-emitting element and prompted by the driver.

The inventors also propose a method for operating a display apparatus in a motor vehicle, particularly an automobile, having at least one display element, which can be used to display at least one value and which has at least one light-emitting element for adjusting a display brightness for the display element. The display apparatus also comprises a sensing device having at least one sensing element for sensing an ambient brightness for surroundings of the display element. In this case, the display brightness can be adjusted by the light-emitting element on the basis of the sensed ambient brightness.

In order to bring about inexpensive manufacture and low weight for the display apparatus, the proposal provides for at least one function of the motor vehicle that is different than the adjustment of the display brightness to be prompted when the change in the ambient brightness is sensed by the sensing device. Advantageous embodiments of the proposed display apparatus can be regarded as advantageous embodiments of the proposed method.

The method allows mechanical operating elements to be dispensed with and hence disadvantages entailed by the use of mechanical operating elements, such as installation space requirement, weight, wear, noise generation and/or the like, to be avoided, since the light-emitting element that is provided anyway is used to prompt the function.

The inventors further propose a motor vehicle having such a display apparatus, the costs of which can be kept particularly low on account of the inexpensive display apparatus.

BRIEF DESCRIPTION OF THE DRAWINGS

These and other objects and advantages of the present invention will become more apparent and more readily appreciated from the following description of the preferred embodiments, taken in conjunction with the accompanying drawings of which.

DETAILED DESCRIPTION OF THE PREFERRED EMBODIMENT

Figure 1:
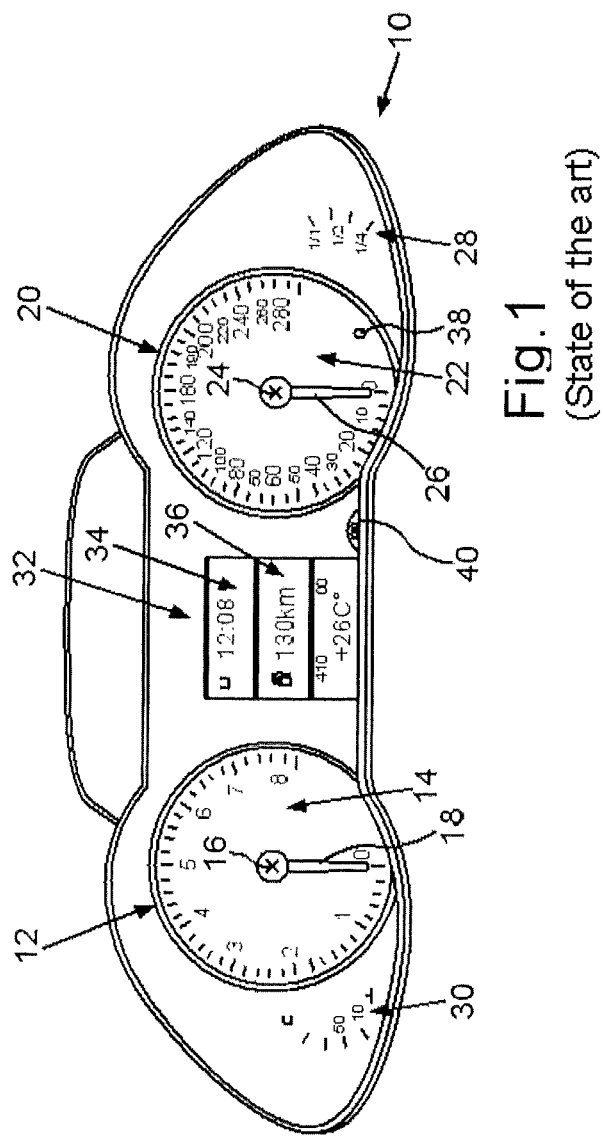
FIG. 1 shows a schematic front view of a display apparatus in an automobile according to the related art.

Reference will now be made in detail to the preferred embodiments of the present invention, examples of which are illustrated in the accompanying drawings, wherein like reference numerals refer to like elements throughout.

Figure 2:
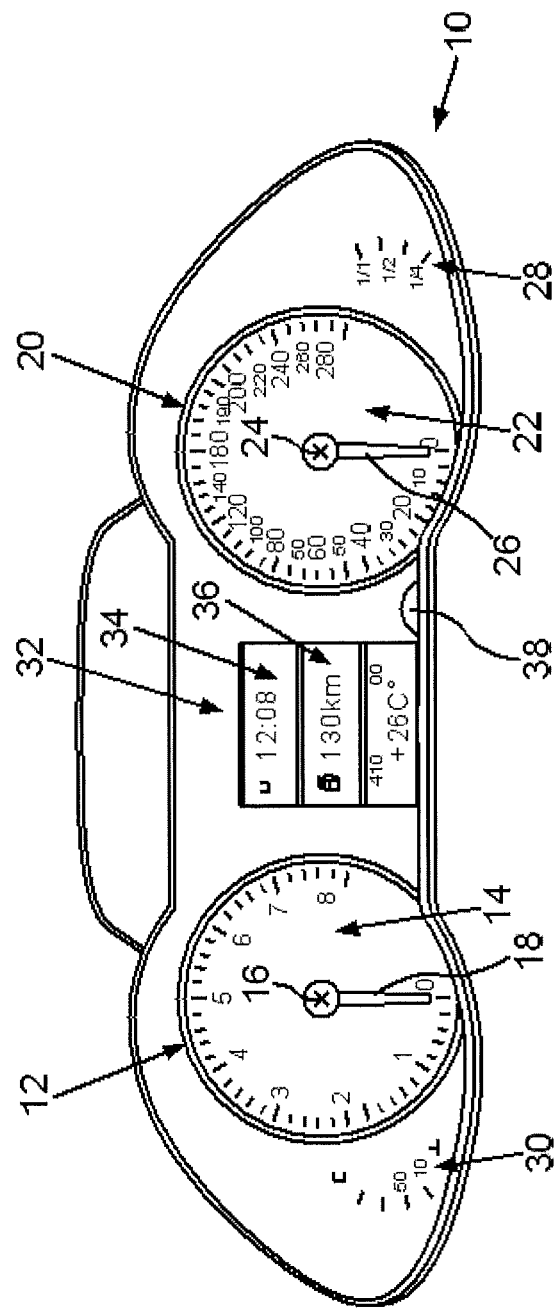
FIG. 2 shows a schematic front view of a further embodiment of the display apparatus shown in FIG. 1, in which a display brightness for respective display elements of the display apparatus is adjusted by using a sensing element that can be used to sense an ambient brightness for surroundings of the display elements.

FIG. 2 shows a display apparatus 10 in an automobile, with the same reference symbols denoting the same elements in FIGS. 1 and 2. The display apparatus 10 shown in FIG. 2 is now different than the display apparatus 10 shown in FIG. 1 in that the sensing device is designed to prompt at least one function of the motor vehicle that is different than the adjustment of the display brightness when a change in the ambient brightness is sensed. In the present case, said function that is different than the adjustment of the display brightness is the zeroing of the value of the daily odometer reading, which can be displayed by the fifth display element 32, for example.

In this case, the sensing device, particularly the sensing element 38, is assigned a dual function, since it is used firstly to adjust the display brightness on the basis of the ambient brightness and secondly to prompt the function that is different than this.

As can be seen from FIG. 2, this dual function allows the mechanical operating element 40 to be dispensed with, as a result of which it is also possible to avoid disadvantages entailed by the use of the operating element 40, such as installation space requirement, weight, noise generation, wear, necessary wiring for the mechanical operating element 40, etc.

The sensing element 38, which is a photodiode or a phototransistor, for example, is used as a pushbutton switch for prompting the function. In this case, the sensing element 38 is designed such that in the event of rapid darkening, i.e. in the event of a rapid decrease in the ambient brightness, the zeroing of the value of the daily odometer reading is prompted. By way of example, rapid darkening of this kind arises when the driver of the automobile covers the sensing element 38 with his finger and places his finger over the sensing element 38, for example. In this case, the driver can place his finger on the sensing element 38 or on a panel of the display apparatus 10 that covers the sensing element 38, as a result of which the sensing element 38 provides a pushbutton switch that can be operated in the manner of a touch-sensitive operating element.

In order to indicate this possibility of prompting the function by the sensing element 38, the sensing element 38 may be provided with an appropriate label. In order to be able to prompt the function for the driver in a manner that is advantageous in terms of ergonomics, the operating element 40 is replaced by the sensing element 38 in this case. In other words, the sensing element 38 is arranged in place of the operating element 40.

The rapid darkening outlined previously that results in the function being prompted is defined by virtue of the ambient brightness being decreased by a prescribable amount within a prescribable period of time, for example. This involves a gradient that characterizes the rapidity of the decrease or decline in the ambient brightness. However, if there is a decrease in the ambient brightness by the prescribable amount in a correspondingly longer period of time and/or if there is a decrease in the ambient brightness by a correspondingly smaller amount within the prescribable period of time, so the gradient of the decrease in the ambient brightness is less than is needed for prompting the function, it is inferred that the darkening is prompted by something else other than by the driver of the automobile. In that case, the function is not prompted, but rather the display brightness is adjusted, i.e. altered, and matched to the altered ambient brightness.

In order to prevent the function from being mistriggered particularly reliably, there may also be at least one further criterion provided, which, when met together with the presence of the rapid darkening, prompts the function.

If the rapid darkening occurs multiple times within a prescribable period of time and/or if the rapid darkening is performed over a prescribable period of time, i.e. if the sensing device is used to sense a drop below a prescribable threshold value by the ambient brightness over a prescribable period of time, then this can prompt a second function, for example, that is different than the first function and than the adjustment of the display brightness. By way of example, this allows a further value that can be displayed by the display apparatus 10 to be altered, in particular zeroed.

The invention has been described in detail with particular reference to preferred embodiments thereof and examples, but it will be understood that variations and modifications can be effected within the spirit and scope of the invention covered by the claims which may include the phrase "at least one of A, B and C" as an alternative expression that means one or more of A, B and C may be used, contrary to the holding in *Superguide v. DIRECTV*, 69 USPQ2d 1865 (Fed. Cir. 2004).

The invention claimed is:

1. A display apparatus in a motor vehicle, comprising:
   a display element to display an informational item value, the display element having a light-emitting element to illuminate the display element; and
   a sensing device comprising:
     a sensing element to sense an ambient brightness of surroundings of the display element; and
     a control unit:
       to adjust a brightness of the display element by adjusting a display brightness of the light-emitting element based on the ambient brightness sensed by the sensing element, and
       to actuate a different function of the motor vehicle that is different from adjusting the brightness of the display element, when a decrease in the ambient brightness is sensed by the sensing element, which is equal to or greater than a prescribed decrease in the ambient brightness, wherein
   when the sensing element senses a decrease in the ambient brightness which is equal to or greater than the prescribed decrease in the ambient brightness because a driver of the motor vehicle has at least partially covered the sensing element, the different function of the motor vehicle is actuated without adjusting the brightness of the display element.

2. The display apparatus as claimed in claim 1, wherein the different function comprises altering a reading displayed by a display instrument of the motor vehicle.

3. The display apparatus as claimed in claim 1, wherein the motor vehicle has a trip odometer to display an odometer reading, and
   the different function comprises zeroing the odometer reading of the trip odometer.

4. The display apparatus as claimed in claim 1, wherein the sensing device actuates the different function when the ambient brightness decreases by a prescribed amount within a prescribed period of time.

5. The display apparatus as claimed in claim 1, wherein the sensing device selectively actuates first and second different functions,
   the first different function is actuated when there is a first type of change in the ambient brightness, and
   the second different function is actuated when there is a second type of change in the ambient brightness, which is different from the first type of change in the ambient brightness.

6. The display apparatus as claimed in claim 5, wherein the first and second types of change in the ambient brightness are different from one another in terms of at least one of frequency and period,
   the frequency is a frequency of the decrease in, the ambient brightness, the frequency being sensed by the sensing device by sensing a plurality of ambient light decreases within a prescribed period of time, and
   the period is a period of time for which the sensing device senses that the ambient light has a dropped below a prescribed threshold value.

7. The display apparatus as claimed in claim 5, wherein the motor vehicle has a trip odometer to display an odometer reading,
   the first different function comprises zeroing the odometer reading of the trip odometer, and
   the second different function resets calculation for at least one of an average fuel consumption and an average speed of the motor vehicle.

8. The display apparatus as claimed in claim 5, wherein the first type of change in the ambient brightness is identified when the ambient brightness decreases by a prescribed amount within a prescribed first period of time and the ambient brightness is maintained at a decreased level for less than a prescribed second period of time, and
   the second type of change in the ambient brightness is identified when the ambient brightness decreases by the prescribed amount within the prescribed first period of time and the ambient brightness is maintained at the decreased level for at least the prescribed second period of time.

9. The display apparatus as claimed in claim 5, wherein the first type of change in the ambient brightness is identified when the ambient brightness decreases by a prescribed amount within a prescribed first period of time, and
   the second type of change in the ambient brightness is identified when the ambient brightness decreases by the prescribed amount more than once within a prescribed second period of time.

10. The display apparatus as claimed in claim 1, wherein the display element is a combination instrument cluster.

11. The display apparatus as claimed in claim 1, wherein the display element comprises a liquid crystal display screen.

12. The display apparatus as claimed in claim 1, wherein the sensing element is a photodiode or a phototransistor.

13. The display apparatus as claimed in claim 1, further comprising:
    a label provided on the display element to identify a location of the sensing element.

14. A motor vehicle having a display apparatus as claimed in claim 1.

15. A method for operating a display apparatus in a motor vehicle, comprising:
    using a display element to display an informational item value;
    illuminating the display element with a light-emitting element;
    using a sensing element of a sensing device for sensing an ambient brightness of surroundings of the display element;

adjusting a brightness of the display element by adjusting a display brightness of the light-emitting element based on the ambient brightness; and actuating a different function of the motor vehicle that is different from adjusting the brightness of the display element when a decrease in the ambient brightness is sensed by the sensing device, which is equal to or greater than a prescribed decrease in the ambient brightness, wherein when the sensing element senses a decrease in the ambient brightness which is equal to or greater than the prescribed decrease in the ambient brightness because a driver of the motor vehicle has at least partially covered the sensing element, the different function of the motor vehicle is actuated without adjusting the brightness of the display element.

16. The method as claimed in claim 15, wherein the sensing device senses a finger covering the sensing element by sensing the prescribed decrease in the ambient brightness.

17. The method as claimed in claim 15, further comprising:

outputting audible feedback to the driver, indicating that the different function of the motor vehicle is being actuated.

* * * * *